United States Patent [19]
Scheck

[11] Patent Number: 6,075,980
[45] Date of Patent: Jun. 13, 2000

[54] INTERFERENCE SUPPRESSION IN RF SIGNALS

[76] Inventor: Hans-Otto Scheck, Soukanlahdentie 3 A 7, FIN-02360 Espoo, Finland

[21] Appl. No.: 09/052,399

[22] Filed: Mar. 31, 1998

[30] Foreign Application Priority Data

Apr. 4, 1997 [FI] Finland ..................................... 971387

[51] Int. Cl.[7] ........................................... H04Q 7/20
[52] U.S. Cl. .......................... 455/324; 455/310; 455/296; 455/209; 455/324; 375/346
[58] Field of Search ...................... 455/266, 324, 455/45, 189.1, 190.1, 205, 209, 222, 296, 310, 318, 304, 340, 67.3, 501, 283, 302, 303; 375/285, 329, 332, 346

[56] References Cited

U.S. PATENT DOCUMENTS

| | | | |
|---|---|---|---|
| 5,003,621 | 3/1991 | Gailus | 455/209 |
| 5,179,730 | 1/1993 | Loper | 455/266 |
| 5,212,826 | 5/1993 | Rabe et al. | 455/214 |
| 5,557,642 | 9/1996 | Williams | 455/323 |
| 5,613,233 | 3/1997 | Vagher | 455/296 |
| 5,784,686 | 7/1998 | Wu et al. | 455/45 |
| 5,826,180 | 10/1998 | Golan | 455/302 |
| 5,828,955 | 10/1998 | Lipowski et al. | 455/324 |
| 5,918,167 | 6/1999 | Tiller et al. | 455/310 |

*Primary Examiner*—Edward F. Urban
*Assistant Examiner*—Yemane Woldetatios
*Attorney, Agent, or Firm*—Perman & Green, LLP

[57] ABSTRACT

An I/Q direct conversion receiver has an input (5,6) for receiving an RF signal comprising a wanted signal having in-phase and quadrature phase channels modulated onto in-phase and quadrature carrier signals. A signal splitter (7) divides the receiver RF signal into three in-phase signal components. Three substantially identical mixers (8) are provided and receive respective RF signal components for mixing with local oscillator signals. The first mixer (8a) receives the local oscillator signal shifted by 45°, the second mixer (8b) receives the local oscillator signal shifted by −45°, whilst the third mixer (8c) receives the local oscillator signal shifted by 180°. A correction signal is generated by summing at a summing amplifier (11) the first and second baseband signals together with the third baseband signal after appropriate scaling. The in-phase and quadrature phase baseband signals are then corrected by combining these signals at respective comparators (13) with the correction signal.

14 Claims, 2 Drawing Sheets

INTERFERENCE SUPPRESSION IN RF SIGNALS

FIELD OF THE INVENTION

The present invention relates to a method and apparatus for suppressing interference in radio frequency (RF) signals. More particularly, the present invention relates to the suppression of interference in direct conversion RF receivers.

BACKGROUND OF THE INVENTION

The majority of radio receivers utilise a superheterodyne type receiver which shifts the carrier frequency of a selected radio channel from an initial high frequency to a lower fixed intermediate frequency (IF) prior to demodulating the information signal. The superheterodyne receiver performs bandpass filtering at the IF frequency so that the bandwidth of the filter can be relatively small whilst still allowing for receipt of a large number of channels from which a desired channel can be chosen. The dynamic range of the superheterodyne receiver is therefore considerable.

An alternative to the superheterodyne receiver is the homodyne or direct conversion receiver which comprises a tunable local oscillator (LO) which is tuned to the carrier frequency of the radio signal to be received. The LO signal is mixed with the radio signal to directly down-convert the radio signal into a baseband signal. Due to the relative simplicity of the direct conversion receiver, there has long been interest in using such receivers in applications where cost and size are of critical importance. One such application is that of mobile communication devices. However, the limited dynamic range provided by direct conversion receivers has in practice restricted their use. The key factor responsible for this limitation is the spurious amplitude modulation (AM) and DC components generated by the mixer in the demodulated signal. As is illustrated in FIG. 1, this interference arises from RF signals leaking from the RF input 1 of the mixer 2 to the local oscillator input 3 which in turn gives rise to even ordered products in the output 4 of the mixer 2. For example, with a signal sinx, leakage results in a product $(sinx)^2 = 1 + sin2x$ where the first term contributes a DC component.

In the case of digital data reception, the receiver decides upon whether or not a received digital data sample is a 0 or a 1 on the basis of the DC voltage level of the demodulated signal. Thus, any DC offset caused by RF signals coupling to the local oscillator input of the mixer (or LO signal leaking into the RF input) can result in the receiver making a wrong decision as to the state of the received signal. In direct conversion receivers, it is necessary to bandpass filter the input signal over a relatively narrow bandwidth in order to minimise cross-channel interference. The dynamic range of a direct conversion receiver (or the number of channels which it can receive) is therefore relatively small compared to that of a superheterodyne receiver.

A number of potential solutions to this problem have been proposed. These tend to rely upon the use of DC filters. However, when a narrow band filter is used, the settling time becomes long such that the filter cannot react to quick changes of power. On the other hand, with a wideband filter it is possible to achieve a short settling time but at cost of filtering out a substantial part of the wanted signal.

U.S. Pat. No. 5,212,826 describes a method of compensating a wanted signal for DC offset by blocking the received RF signal from entering the receiver during periods when the wanted signal is not transmitted. The DC offset during this period is measured and a resulting constant correction factor is calculated and fed into a correction circuit which processes the RF signal during the subsequent reception period. However, because the correction factor is constant over a continuous reception period, variations in the DC level during this period are not compensated for.

There is described in U.S. Pat. No. 5,179,730 a direct conversion receiver suitable for demodulating quadrature phase shift modulated (QPSM) signals. Conventional QPSM receivers split a received RF signal into two signal components. These components are applied to respective mixers, with the first mixer mixing the received signal with a LO signal which is 90° out of phase with the LO signal applied to the second mixer. U.S. Pat. No. 5,179,730 addresses the problem of mismatching occurring between the two mixers and the LO signals and which results in phase and amplitude errors in the demodulated baseband signals. U.S. Pat. No. 5,179,730 proposes providing a third mixer which mixes the input signal with a third LO signal which is out of phase with both of the LO signals applied to the first and second mixers. The outputs of the mixers are combined to produce a correction signal which is used to compensate phase and amplitude errors in the in-phase and quadrature phase signals. This document does not address the problem of spurious amplitude modulation (AM) and DC components generated at the mixer. Indeed, if such components are present, the efficiency of the mixer mismatch correction will be reduced.

SUMMARY OF THE INVENTION

According to a first aspect of the present invention there is provided a method of suppressing interference in a direct conversion RF receiver, the method comprising the steps of:

receiving an RF signal containing a wanted signal modulated onto at least one carrier signal at a carrier frequency;

splitting the RF signal into at least first, second and third RF signal components;

mixing said RF signal components with respective first, second and third local oscillator signals at said carrier frequency and phase shifted relative to one another, to produce first, second and third baseband signals containing first, second and third phase shifted wanted signal components respectively;

combining said baseband signals so as to substantially cancel the first, second and third phase shifted wanted signals and providing the residual signal as a correction signal; and combining the correction signal with at least one of the baseband signals to correct that signal for interference.

It will be appreciated that the present invention is particularly applicable to direct conversion RF receivers in which second order interference effects are generated in the RF mixer.

Preferably, said step of combining the baseband signals comprises scaling at least one of the baseband signals by a predetermined factor and summing the scaled baseband signal(s) with the other baseband signal(s). Said step of combining the correction signal with at least one of the baseband signals may comprise the step of scaling the correction signal.

Where the wanted signal comprises an in-phase signal component (I) and a quadrature phase signal component (Q) modulated onto respective phase shifted carrier signals having a common carrier frequency, the phase shift between said first and second local oscillator signals is preferably substantially 90 degrees so that said first and second baseband signals contain the demodulated in-phase and quadrature phase signal components respectively. Preferably, the third local oscillator signal is offset by 135° from both the first and second local oscillator signals in which case the first, second and third baseband signals are scaled in the ratio $$1:1:\sqrt{2}$$

prior to summing. However, it will be appreciated that other phase shifts may be used and the scaling ratio determined accordingly. Preferably, the correction signal is subtracted from both the first and second baseband signals in order to correct these signals for interference. The results of the subtractions in the case of in-phase/quadrature phase modulation are an in-phase wanted signal component and a quadrature phase wanted signal component.

The RF signal may be split into four or more RF signal components, each component being mixed with a phase shifted local oscillator signal to produce respective baseband signals each of which contains a phase shifted wanted signal. A correction signal is generated by scaling and summing the baseband signals, in accordance with the relative phase shifts, to cancel the wanted signal components.

According to a second aspect of the present invention there is provided a direct conversion RF receiver comprising:

input means for receiving an RF signal containing a wanted signal modulated onto at least one carrier signal at a carrier frequency;

splitting means coupled to the input means for splitting the received RF signal into at least first, second and third RF signal components;

first, second and third mixing means coupled to the splitting means for receiving respective RF signal components and for mixing the received RF components with respective local oscillator signals at said carrier frequency and phase shifted relative to one another, to produce first, second and third baseband signals containing first, second and third phase shifted wanted signal components respectively;

first combining means coupled to the mixing means for combining said baseband signals so as to substantially cancel the phase shifted wanted signal components and for providing the residual signal as a correction signal; and second combining means coupled to said first combining means and to at least one of the mixing means for subtracting the correction signal from at least one of the baseband signals to correct that signal for interference.

Preferably, said first combining means comprises scaling means for scaling at least one of the baseband signals by a predetermined scaling factor and summing means, e.g. a summing amplifier, for summing the scaled baseband signal (s) and the other baseband signal(s). Said second combining means may also comprise scaling means for scaling the correction signal.

Preferably, all of said mixing means are provided on a common semiconductor wafer so as to minimise differences in the operational performance of the mixers.

Preferably, the receiver comprises a local oscillator for generating said local oscillator signals and phase shifting means for producing the relative phase shifts between said local oscillator signals.

According to third aspect of the present invention there is provided a mobile communication device comprising a direct conversion RF receiver according to the above second aspect of the present invention.

DETAILED DESCRIPTION

Figure 1:
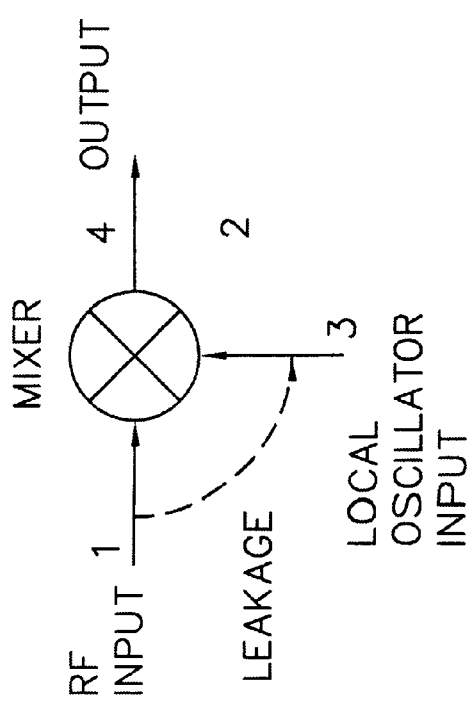
FIG. 1 shows schematically a mixer with RF signal leakage from an RF input to a local oscillator input.
Figure 2:
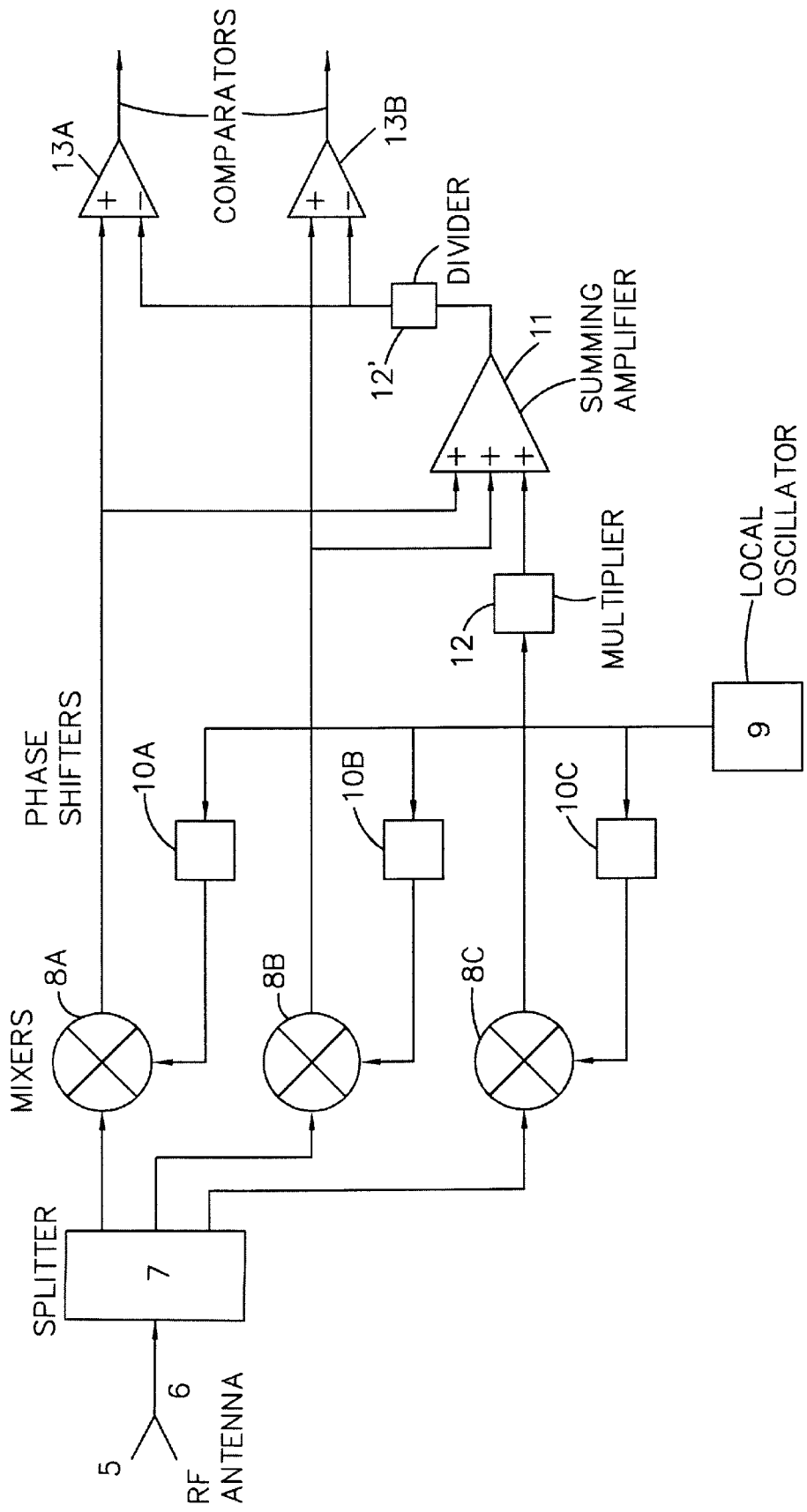
FIG. 2 shows schematically a direct conversion RF receiver embodying the present invention.

As has already been described with reference to FIG. 1, in a direct conversion receiver, it is often the case that a small amount of RF signal leaks from the RF input 1 of the mixer 2 to the local oscillator input 3 resulting in DC and slowly varying AM interference components in the mixed or baseband signal at the output 4 of the mixer 2. DC and slowly varying AM interference components also arise from the non-ideal properties of the mixer 2. There is illustrated in FIG. 2 a direct conversion RF receiver which allows these interference component to be substantially suppressed. It will be appreciated that the receiver will typically comprise a number of other components, e.g. amplifiers and filters, but these are not shown in FIG. 2 for reasons of simplification.

An RF signal is detected at an RF antenna 5. The RF signal comprises a multiplicity of signal components, one of which is an in-phase/quadrature modulated signal (the 'wanted' signal) at a carrier frequency $f_c$. The detected RF signal is in turn applied to an input 6 of a splitter 7 which splits the RF signal into three equal and in-phase RF signal components. These components are applied to the inputs of respective first, second, and third mixers 8a, 8b, and 8c.

A local oscillator 9 generates a local oscillator signal having a constant frequency equal to the carrier frequency $f_c$ of the wanted signal. The local oscillator signal is split into first, second and third identical local oscillator signal components. Each local oscillator signal component is phase shifted by a predetermined amount by a respective phase shifting circuit 10a, 10b, and 10c. The first local oscillator signal component is shifted by +45° relative to the generated local oscillator signal, the second local oscillator signal is shifted by −45°, and the third local oscillator signal is shifted by 180°. The local oscillator signal components are applied to respective mixers 8a, 8b, and 8c.

The three mixers 8a, 8b, and 8c produce at their respective outputs first, second, and third baseband signals. The first baseband signal comprises the downconverted wanted signal shifted by 45.° plus interference generated by coupling between the inputs to the associated mixer 8a. In fact, this downconverted and phase shifted signal is the demodulated in-phase component I. Similarly, the second baseband signal comprises the downconverted wanted signal shifted by −45° (the quadrature phase component Q) plus the interference, whilst the third baseband signal comprises the downconverted wanted signal shifted by 180° (a 'reference' component R) plus the interference.

Figure 3:
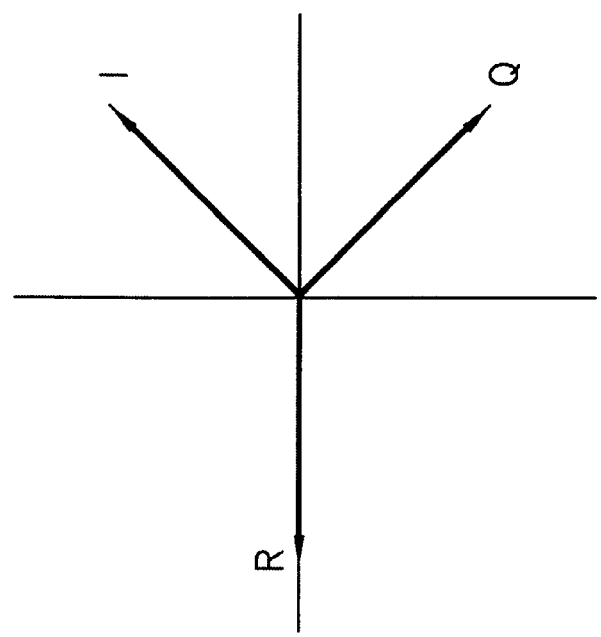
FIG. 3 shows a phasor diagram of the baseband signals generated by mixers of the direct conversion RF receiver of FIG. 2.

FIG. 3 illustrates the three downconverted wanted signal components I,Q and R contained within the baseband signals. It will be appreciated that if the third baseband signal is multiplied by a factor of $$\sqrt{2},$$

and the resulting scaled signal is summed with the first and second baseband signals, the wanted signal components I,Q and R in the three baseband signals will cancel out. Assuming that the three mixers 8a, 8b, and 8c are substantially identical, a similar degree of cross-coupling between the respective inputs will occur and the baseband signals will each contain a substantially identical interference signal. Whilst the summing of the baseband signals will substantially cancel the wanted signal components, the interference components I will be superimposed on one another, i.e. the summed signal will contain an interference signal equal.

$$(2+\sqrt{2})I.$$

The output of the third mixer 8c is provided to an input of a summing amplifier 11 via a multiplier 12 which multiplies the mixer output by a factor of.

$$\sqrt{2}.$$

The outputs of the first and second mixers 8a, 8b are provided directly to respective summing amplifier inputs.

The output of the summing amplifier 11 is provided to a divider 12' which divides the amplifier output by $$(2+\sqrt{2})$$

and provides a correction signal which is combined with the first and second baseband signals at first and second comparators 13a, 13b. The comparators 13a, 13b provide at their outputs corrected in-phase and quadrature phase components of the wanted signal.

In order to ensure that each of the baseband signals comprises a substantially identical interference component, the mixers 8a, 8b, and 8c are as closely matched as possible. This typically involves fabricating the mixers on a common semiconductor wafer. The summing amplifier 11, divider 12', comparators 13a, 13b. and other receiver components, can also be fabricated on the same wafer to provide a completely integrated direct conversion receiver.

It will be appreciated that modifications may be made to the above described embodiment without departing from the scope of the invention. For example, the relative phase shifts between the first, second and third local oscillator signal components may be any appropriate value, e.g. a constant 120 degrees or 0, 90, and 180 degrees. Mismatching between the mixers may be compensated for, to some extent, by splitting the RF signal into four or more components and by mixing these components with respective phase shifted LO signals. The resulting baseband signals can then be scaled and summed to provide a single correction signal. However, this increases the complexity and power consumption of the receiver.

I claim:

1. A method of suppressing interference in a direct conversion RF receiver, the method comprising the steps of:
   receiving an RF signal containing a wanted signal modulated onto at least one carrier signal at a carrier frequency;
   splitting the RF signal into at least first, seconds, and third RF signal components;
   mixing said RF signal components respectively with first, second, and third local oscillator signals at said carrier frequency and phase shifted relative to one another, to produce first, second, and third baseband signals containing first, second, and third phase shifted wanted signal components, respectively; summing signals representing each
   of said first, second, and third baseband signals, said representing signals each comprising either its respective baseband signal or a scaled signal of said respective baseband signal, so as to substantially cancel the first, second, and third phase shifted wanted signal components to provide the residual signal as a correction signal; and
   combining the correction signal with at least one of the baseband signals to correct that signal for interference.

2. A method according to claim 1, wherein the wanted signal comprises an in-phase signal component and quadrature phase signal component, with the phase shift between said first and second local oscillator signals being substantially 90 degrees so that said first and second baseband signals contain the demodulated in-phase and quadrature phase signal components, respectively.

3. A method according to claim 2, wherein the third local oscillator signal is offset by substantially 135° from both the first and second local oscillator signals and the first, second, and third baseband signals are scaled in the approximate ratio $$1:1:\sqrt{2}$$

prior to summing and the correction signal is divided by approximately $$(2+\sqrt{2})$$

prior to combining with said at least one baseband signal.

4. A method according to claim 1, wherein the correction signal is scaled and subtracted from both the first and second baseband signals in order to correct these signals for interference.

5. A method according to claim 1 further comprising the steps of:
   splitting the RF signal into four or more RF signal components,
   mixing each of said RF signal components respectively with a local oscillator signal phase shifted relative to the other local oscillator signals, to produce respective baseband signals containing respective phase shifted wanted signal components,
   and wherein the summing step comprises summing signals representative of all of the resulting baseband signals to substantially cancel the phase shifted wanted signal components to provide said correction signal.

6. A direct conversion RF receiver comprising:
   input means for receiving an RF signal containing a wanted signal modulated onto at least one carrier signal at a carrier frequency;
   splitting means coupled to the input means for splitting the received RF signal into first, second, and third RF signal components;
   first, second, and third mixing means coupled to the splitting means for receiving respective RF signal components and for mixing the received RF signal components with respective local oscillator signals at said carrier frequency and phase shifted relative to one another, to produce first, second, and third baseband signals containing first, second, and third phase shifted wanted signal components, respectively;

summing means coupled to the mixing means for summing signals representing each of said first, second, and third baseband signals, said representing signals each comprising either its respective baseband signal or a scaled signal of said respective baseband signal so as to substantially cancel the phase shifted wanted signal components and providing the residual signal as a correction signal; and combining means coupled to said summing means and to at least one of the mixing means for subtracting the correction signal from at least one of the baseband signals to correct that signal for interference.

7. A receiver according to claim 6, wherein all of the mixing means are provided on a common semiconductor wafer so as to minimise differences in the operational performance of the mixers.

8. A receiver according to claim 7 and comprising a local oscillator for generating said local oscillator signals and phase shifting means for producing the relative phase shifts between said local oscillator signals, said local oscillator and said phase shifting means being provided on said common wafer.

9. A receiver according to claim 6, further comprising means for scaling and subtracting the correction signal from both the first and second baseband signals in order to correct these signals for interference.

10. A receiver according to claim 6 further comprising:

means for splitting the RF signal into four or more RF signal components, means for mixing each of said RF signal components respectively with a local oscillator signal phase shifted relative to the other local oscillator signals, to produce respective baseband signals containing respective phase shifted wanted signal components, and wherein the said summing means comprises means for summing signals representative of all of the resulting baseband signals to substantially cancel the phase shifted wanted signal components to provide said correction signal.

11. A mobile communication device comprising a direct conversion RF receiver comprising:

input means for receiving an RF signal containing a wanted signal modulated onto at least one carrier signal at a carrier frequency;

splitting means coupled to the input means for splitting the received RF signal into first, second, and third RF signal components;

first, second, and third mixing means coupled to the splitting means for receiving respective RF signal components and for mixing the received RF signal components with respective local oscillator signals at said carrier frequency and phase shifted relative to one another, to produce first, second, and third baseband signals containing first, second, and third phase shifted wanted signal components, respectively;

summing means coupled to the mixing means for summing signals representing each of said first, second, and third baseband signals, said representing signals each comprising either its respective baseband signal or a scaled signal of said respective baseband signal so as to substantially cancel the phase shifted wanted signal components and providing the residual signal as a correction signal; and combining means coupled to said summing means and to at least one of the mixing means for subtracting the correction signal from at least one of the baseband signals to correct that signal for interference.

12. A device according to claim 11, further comprising means for scaling and subtracting the correction signal from both the first and second baseband signals in order to correct these signals for interference.

13. A device according to claim 11, wherein all of the mixing means are provided on a common semiconductor wafer so as to minimize differences in the operational performance of the mixers.

14. A device according to claim 13 and comprising a local oscillator for generating said local oscillator signals and phase shifting means for producing the relative phase shifts between said local oscillator signals, said local oscillator and said phase shifting means being provided on said common wafer.

* * * * *